United States Patent
Kawamoto

(10) Patent No.: US 11,049,747 B2
(45) Date of Patent: Jun. 29, 2021

(54) SIC FREESTANDING FILM STRUCTURE

(71) Applicant: ADMAP INC., Tamano (JP)

(72) Inventor: Satoshi Kawamoto, Tamano (JP)

(73) Assignee: ADMAP INC., Okayama (JP)

( * ) Notice: Subject to any disclaimer, the term of this patent is extended or adjusted under 35 U.S.C. 154(b) by 0 days.

(21) Appl. No.: 16/498,209

(22) PCT Filed: Aug. 28, 2019

(86) PCT No.: PCT/JP2019/033683
§ 371 (c)(1),
(2) Date: Sep. 26, 2019

(87) PCT Pub. No.: WO2020/174724
PCT Pub. Date: Sep. 3, 2020

(65) Prior Publication Data
US 2021/0005469 A1    Jan. 7, 2021

(51) Int. Cl.
*H01L 21/67* (2006.01)
*H01L 21/673* (2006.01)
(Continued)

(52) U.S. Cl.
CPC ............ *H01L 21/6733* (2013.01); *B28B 1/30* (2013.01); *C23C 16/325* (2013.01)

(58) Field of Classification Search
CPC ......... H01L 21/02002; H01L 21/02378; H01L 21/02447; H01L 21/02513; H01L 21/02529; H01L 21/02595; H01L 21/02598; H01L 21/0262; H01L 21/02634; H01L 21/02658; H01L 21/185;
(Continued)

(56) References Cited

U.S. PATENT DOCUMENTS

| 6,562,183 B1 * | 5/2003 | Yamada | C23C 16/325 156/345.1 |
| 9,422,640 B2 * | 8/2016 | Ohno | C30B 25/20 |

(Continued)

FOREIGN PATENT DOCUMENTS

| EP | 0 582 444 A1 | 2/1994 |
| JP | H05-124863 A | 5/1993 |

(Continued)

OTHER PUBLICATIONS

Jan. 7, 2020 Office Action issued in Taiwanese Patent Application No. TW108130220.

*Primary Examiner* — Mohammed Shamsuzzaman
(74) *Attorney, Agent, or Firm* — Oliff PLC

(57) ABSTRACT

A SiC Freestanding Film Structure capable of preventing a functional surface of a SiC Freestanding Film Structure from being affected by a film thickness and improving strength by increasing the film thickness, the SiC Freestanding Film Structure is formed by depositing a SiC layer through a vapor deposition type film formation method. The SiC layer is deposited with respect to a first SiC layer serving as a functional surface in the SiC Freestanding Film Structure. Focusing on the functional surface and a non-functional surface positioned on front and back sides of any particular portion, the functional surface has smoothness higher than that of the non-functional surface.

3 Claims, 3 Drawing Sheets

(51) Int. Cl.
 *B28B 1/30* (2006.01)
 *C23C 16/32* (2006.01)

(58) Field of Classification Search
 CPC .............. H01L 21/265; H01L 21/304; H01L 21/76254; H01L 29/06; H01L 29/1608; H01L 21/6733; B28B 1/30; C23C 16/325
 See application file for complete search history.

(56) References Cited

U.S. PATENT DOCUMENTS

| | | | |
|---|---|---|---|
| 2002/0124793 A1* | 9/2002 | Nakano | C30B 29/36 117/84 |
| 2002/0173125 A1 | 11/2002 | Takeda et al. | |
| 2004/0012024 A1 | 1/2004 | Pickering et al. | |
| 2004/0209445 A1 | 10/2004 | Haerle et al. | |
| 2005/0148202 A1* | 7/2005 | Heiliger | C09J 143/04 438/778 |
| 2005/0287770 A1* | 12/2005 | Hasan | H01L 21/02532 438/481 |
| 2006/0065196 A1* | 3/2006 | Yokogawa | C30B 31/14 118/728 |
| 2013/0247334 A1* | 9/2013 | Huguet | C04B 41/52 23/295 R |
| 2016/0121272 A1* | 5/2016 | Drury | B01D 69/125 210/650 |
| 2018/0251911 A1* | 9/2018 | Kubota | C23C 16/325 |
| 2020/0331816 A1* | 10/2020 | Guercio | C04B 41/87 |

FOREIGN PATENT DOCUMENTS

| | | |
|---|---|---|
| JP | H06-206718 A | 7/1994 |
| JP | 2001-158666 A | 6/2001 |
| JP | 2003-034867 A | 2/2003 |
| JP | 2010-219535 A | 9/2010 |
| TW | 201723212 A | 7/2017 |
| WO | 2018-159754 A1 | 9/2018 |

* cited by examiner (A)

(B)

(C)

(D)

(E)

(F)

US 11,049,747 B2

SIC FREESTANDING FILM STRUCTURE

FIELD OF THE INVENTION

The present invention relates to a SiC film formation technology, and more particularly, to a structure having a SiC Freestanding Film.

BACKGROUND OF THE INVENTION

Due to its excellent environmental resistance and high chemical stability, especially in the field of semiconductor device manufacturing, demands for a Freestanding Film Structure formed of SiC as a tool used at a very high temperature, such as a wafer boat or tube and a dummy wafer, in semiconductor manufacturing are increasing.

In the prior art, such a SiC Freestanding Film Structure is formed through a film formation process and a substrate removal process as discussed in Patent Document 1. Specifically, first, in the film formation process, a SiC film is formed on a surface of the substrate formed of carbon (graphite) or the like through a chemical vapor deposition (CVD) method. The thickness of the SiC film is controlled on the basis of a deposition time, the number of deposited layers, or the like.

Then, in the substrate removal process, the substrate is burned out by heating the substrate subjected to the deposition under a high-temperature oxidation atmosphere. Through such a process, a SiC Freestanding Film Structure having a shape matching the external shape of the substrate is completed.

CITATION LIST

Patent Documents

Patent Document 1: Japanese Unexamined Patent Application Publication No. 2001-158666

SUMMARY OF THE INVENTION

The SiC Freestanding Film Structure formed as described above has a functional surface which is a vapor deposition surface formed through the CVD method. The film thickness formed through the vapor deposition is different depending on a part of the substrate or a position of the substrate. For this reason, particularly when there is an unevenness in the substrate, it is necessary to determine the shape of the substrate by predicting how the film is attached at the time of vapor deposition, that is, the state of the completed SiC Freestanding Film Structure, and there is a difference between the desired shape and the completed shape. In addition, when a substrate having a complicated surface shape is used, a film thickness of a deep portion tends to be reduced in a narrow part. In some cases, such a difference in the product accuracy or the film thickness distribution may significantly affect its function depending on the application of the product.

In the narrow portion, there is a risk of failing to obtain a desired gap by increasing the film thickness, and it is difficult to improve the strength by increasing the film thickness.

In this regard, in order to address the aforementioned problems, the present invention provides a SiC Freestanding Film Structure capable of matching a shape of the function surface to a shape of the substrate with high accuracy and improving the strength by increasing the film thickness.

In order to achieve the aforementioned objects, according to the present invention, there is provided a SiC Freestanding Film Structure formed by depositing a SiC layer on an uneven surface of a substrate having unevennesses through a vapor deposition type film formation method, including employing, as the substrate, a female-molded substrate having inverted unevennesses of a desired structure shape. The SiC layer forms a functional surface on a surface in contact with the female-molded substrate on a first SiC layer configured in contact with the uneven surface of the female-molded substrate.

In the SiC Freestanding Film Structure having the aforementioned characteristics, focusing on the functional surface and a non-functional surface positioned on front and back sides of any particular portion, the functional surface has smoothness higher than that of the non-functional surface. Due to this characteristic, surface treatment such as grinding is not necessary after forming the SiC Freestanding Film Structure. For this reason, it is possible to provide a high quality product even in a structure having a complicated or minute shape.

In the SiC Freestanding Film Structure having the aforementioned characteristics, when the formed surface has a corner portion, the corner portion of the functional surface has a ridge line sharper than that of the non-functional surface. Due to this characteristic, it is possible to reliably obtain accuracy required in a tool or the like.

Using the SiC Freestanding Film Structure having the aforementioned characteristics, it is possible to prevent the functional surface of the SiC Freestanding Film Structure from being affected by the film thickness. In addition, since the functional surface is not affected by the film thickness, it is possible to improve the strength by increasing the film thickness.

DESCRIPTION OF EMBODIMENTS

A SiC Freestanding Film Structure according to an embodiment of the invention will now be described in details with reference to the accompanying drawings. Note that the following embodiments are a part of preferable modes for embodying the invention, and even some modifications for a part of the configuration may be regarded as a part of the invention as long as a specific requirement of the invention is satisfied.

<Configuration>

Figure 1:
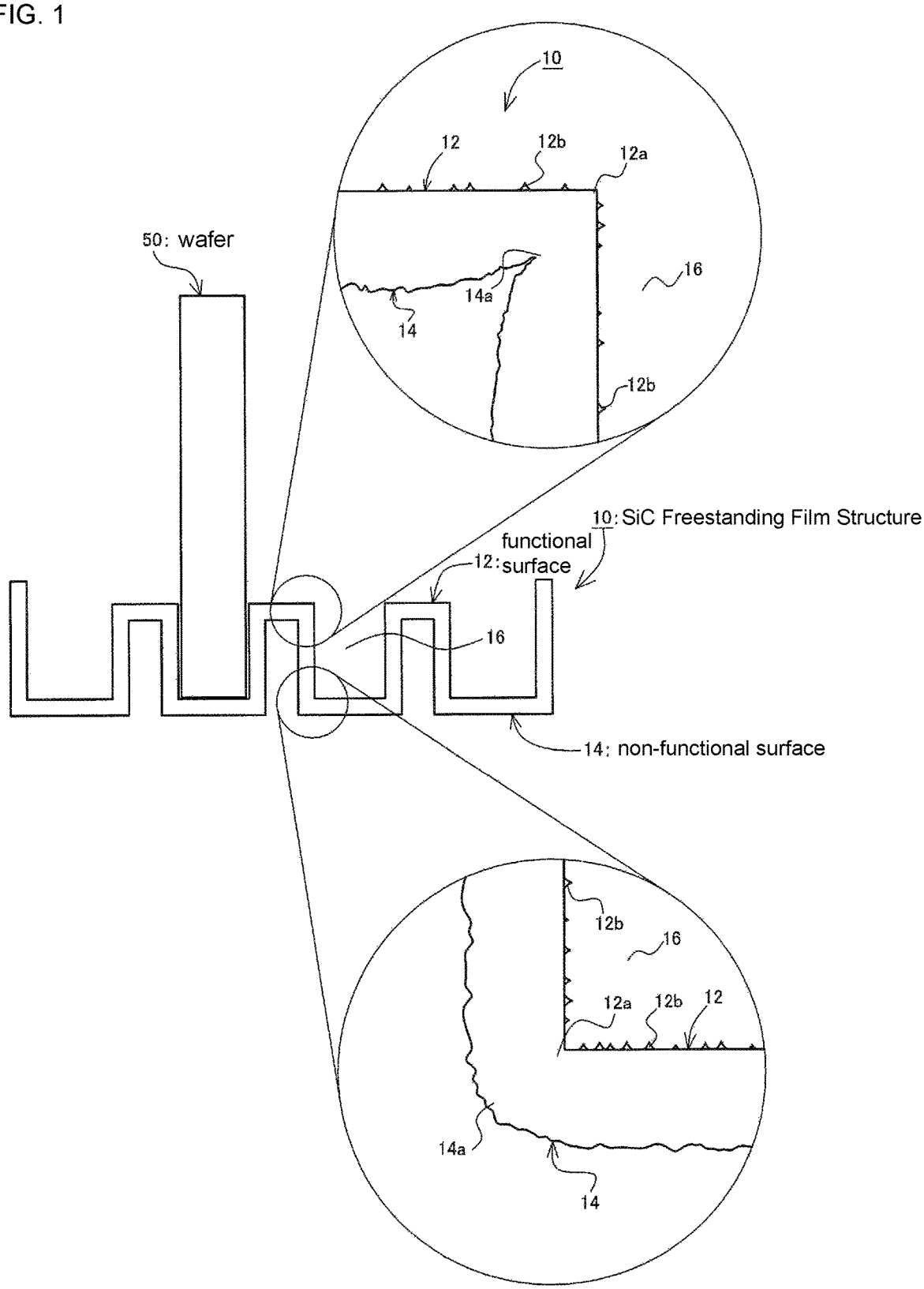
FIG. 1 is a diagram illustrating a configuration of a SiC Freestanding Film Structure according to an embodiment of the invention.

According to this embodiment, a SiC Freestanding Film Structure 10 is configured by allowing a SiC film to have a self-supporting strength. FIG. 1 shows a boat as a tool used in semiconductor wafer manufacturing. However, FIG. 1 also shows that the SiC Freestanding Film Structure 10 according to this embodiment is applicable to various shapes having unevennesses as well as a plane structure, and it is not intended to limit the shape or the application.

The SiC Freestanding Film Structure 10 of FIG. 1 has one surface functioning as a boat. That is, a main surface provided with slits 16 for supporting a wafer 50 is set as a functional surface 12. As recognized from a partially enlarged view surrounded by a circle in FIG. 1, the functional surface 12 of the SiC Freestanding Film Structure 10 according to an embodiment of the invention has a plurality of minute protrusions 12b that are difficult to be obtained through mechanical machining. Since the functional surface 12 has such minute protrusions 12b, it is possible to reduce a contact area between the supported material (for example, a wafer 50) and the SiC Freestanding Film Structure 10. For this reason, it is possible to prevent the wafer 50 from adhering to the SiC Freestanding Film Structure 10 in the event of heating or cooling. In addition, it is possible to suppress a temperature difference between a portion exposed to the gas atmosphere and the contact portion.

Focusing on corner portions 12a and 14a, the corner portion 12a of the functional surface 12 has a sharp corner, whereas the corresponding part (corner portion 14a) of the non-functional surface 14 has a smoother corner, compared to the functional surface 12.

As described below in details, this causes the functional surface 12 of the SiC Freestanding Film Structure 10 to come into contact with the substrate 30 (see FIGS. 2A to 2F) to form a shape matching the surface shape thereof. For this reason, it is possible to match the shape of the functional surface 12 to the shape of the substrate 30 with high accuracy.

<Manufacturing Process>

Figure 2:
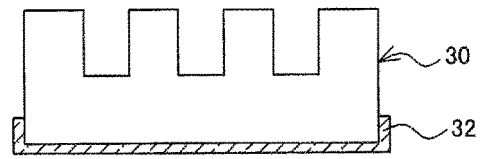
FIGS. 2A to 2F are diagrams for describing a manufacturing process of the SiC Freestanding Film Structure according to an embodiment of the invention.
Figure 2:
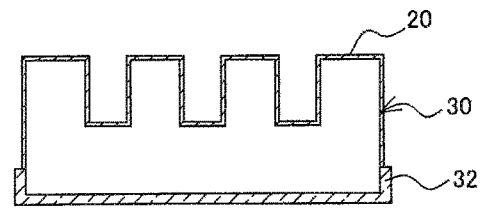
Figure 2:
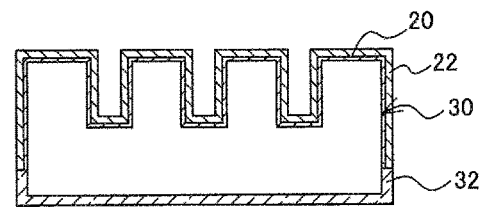
Figure 2:
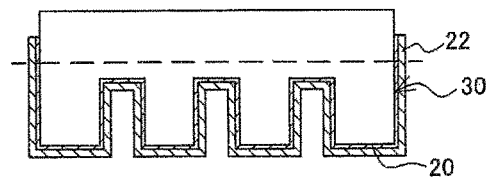
Figure 2:
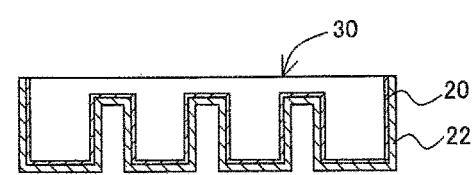
Figure 2:
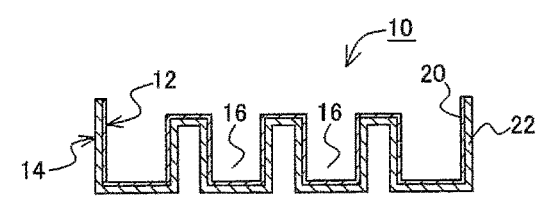

A manufacturing process of the SiC Freestanding Film Structure 10 according to this embodiment having such a configuration will be described with reference to FIGS. 2A to 2F. First, as illustrated in FIG. 2A, a substrate 30 having inverted unevennesses of a desired structure, that is, a female-molded substrate 30 is fabricated. The substrate 30 is preferably formed of a porous material having minute pores on the surface, such as graphite. Note that a masking 32 is applied to a lower end of the substrate 30 to allow installation to a reference surface.

Then, as illustrated in FIG. 2B, a first SiC layer 20 is formed on the surface of the substrate 30 through a vapor deposition type film formation method. Note that the vapor deposition type film formation method may include, for example, a chemical vapor deposition (CVD) method. Here, the graphite surface of the substrate 30 has a plurality of pores. The first SiC layer 20 formed through the CVD method is also formed inside the pores provided on the surface of the substrate 30. The first SiC layer 20 provided inside the pores in this manner is used to form minute protrusions 12b provided on the functional surface 12.

After formation of the first SiC layer 20, as illustrated in FIG. 2C, a laminated SiC layer 22 is formed by deposition with respect to the first SiC layer 20. Here, although it is not necessary to provide any difference in configuration between the first SiC layer 20 and the laminated SiC layer 22 deposited on the first SiC layer 20, the first SiC layer 20 is formed on the surface of the substrate 30. For this reason, the first SiC layer 20 has a shape or property matching that of the substrate 30 with high accuracy.

After the thickness of the laminated SiC layer 22 reaches a level allowing a desired strength, the substrate 30 used to form the SiC layer (including the first SiC layer 20 and the laminated SiC layer 22) is removed from the reference surface, and the unnecessary part (a part over the dotted line in FIG. 2D) is cut out as illustrated in FIG. 2D. After removing the unnecessary part as illustrated in FIG. 2E, the substrate 30 is removed. In a case where graphite is employed as the substrate 30, the substrate 30 may be removed by heating the substrate 30 having the SiC layer formed thereon under a high-temperature oxidation atmosphere.

The graphite heated under a high-temperature oxidation atmosphere is changed to a gas as $CO_2$ and is burned out. For this reason, it is possible to remove the substrate 30 even for a complicated or minute shape difficult to remove through mechanical machining.

By removing the substrate 30 in this manner, it is possible to form a SiC Freestanding Film Structure 10 as illustrated in FIG. 2F.

<Advantageous Effects>

In this manner, the SiC Freestanding Film Structure 10 according to an embodiment of the invention is formed by sequentially depositing the laminated SiC layer 22 with respect to the first SiC layer 20 as the functional surface 12. For this reason, the functional surface 12 of the SiC Freestanding Film Structure 10 has a shape matching that of the substrate 30 with high accuracy. In addition, since the shape accuracy is not affected by the film thickness, it is possible to improve the strength of the SiC Freestanding Film Structure 10 by increasing the film thickness.

<Modifications>

Figure 3:
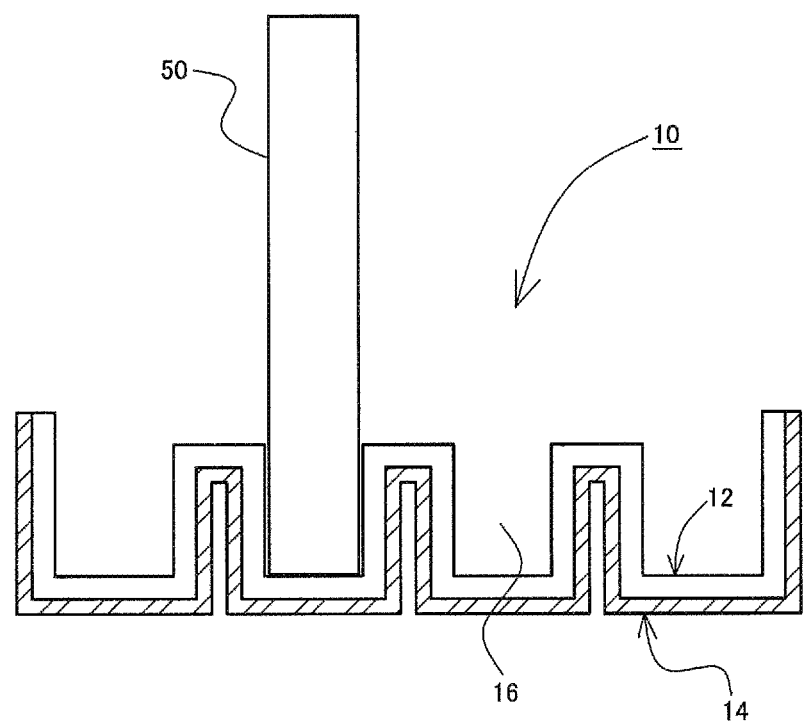
FIG. 3 is a diagram illustrating a modification of the SiC Freestanding Film Structure.

As described above, the functional surface 12 of the SiC Freestanding Film Structure 10 according to this embodiment is not affected by the film thickness. For this reason, as illustrated in FIG. 3, it is possible to maintain desired accuracy of the functional surface 12 even when the widths of trenches on the non-functional surface 14 are narrowed by increasing the film thickness of the SiC film. Therefore, it is possible to provide a SiC Freestanding Film Structure 10 having high fabrication accuracy even when a heavy weight object is disposed or held.

When a metal having a smooth surface is employed as the substrate 30, surface treatment for forming minute unevennesses on the surface (such as sand blasting) may be performed to provide the functional surface 12 having the minute protrusions as described above in the embodiment. Note that, when a metal is employed in the substrate 30, the substrate 30 may be removed by dissolving the substrate 30 with a chemical solution.

The CVD method has been described as a method of forming a vapor deposition type film in the aforementioned embodiment. Using the vapor deposition based on the CVD method, it is possible to uniformize the film thickness, compared to the vacuum type physical vapor deposition (PVD) method or the molecular beam epitaxy (MBE) method. For this reason, the CVD method was effective as a manufacturing method of the SiC Freestanding Film Structure in the prior art, in which the functional surface is the final deposition surface. However, in the SiC Freestanding Film Structure 10 according to an embodiment of the invention, the laminated SiC layer 22 is deposited with respect to the first SiC layer 20 of the functional surface 12. For this reason, it is possible to manufacture the product with high accuracy even when a deposition technique based on the PVD method or the MBE method as the vacuum type deposition method is applied.

In the aforementioned embodiment, a boat has been described as an example of the SiC Freestanding Film Structure 10. However, the shape of the SiC Freestanding Film Structure 10 may also be applied to any shape for various purposes, such as a wafer holder or a susceptor.

REFERENCE SIGNS LIST

10 SiC Freestanding Film Structure,
12 functional surface, 12a corner portion,
12b minute protrusion,
14 non-functional surface,
14a corner portion,
16 slit,
20 first SiC layer,
22 laminated SiC layer,
30 substrate,
32 masking,
50 wafer.

What is claimed is:

1. A SiC Freestanding Film Structure formed by laminating a plurality of SiC layers on a surface of a porous substrate through a vapor deposition type film formation method, and then removing the porous substrate after the plurality of SiC layers have been laminated, comprising
employing, as the porous substrate, a female-molded substrate having an inverted shape of a desired structure shape including a masking to a lower end of the porous substrate, wherein the plurality of SiC layers includes a first SiC layer,
a main surface of the SiC Freestanding Film Structure is a functional surface of the first SiC layer having minute protrusions and the functional surface is configured in contact with the surface of the female-molded substrate
a second SiC layer configured as a non-functional surface is deposited on a side opposite to the functional surface of the first SiC layer, wherein a corner portion of the functional surface sharper than that of the non-functional surface before removing the female-molded substrate.

2. The SiC Freestanding Film Structure according to claim 1, wherein the functional surface has the minute protrusions generated by a material property of the porous substrate.

3. The SiC Freestanding Film Structure according to claim 2, wherein the material of the porous substrate comprises graphite.

* * * * *